United States Patent
Chew et al.

(10) Patent No.: US 8,090,898 B2
(45) Date of Patent: Jan. 3, 2012

(54) NONVOLATILE MEMORY SYSTEM AND METHOD OF DECENTRALIZING THE PEAK CURRENT IN A NONVOLATILE MEMORY SYSTEM

(75) Inventors: Chung-Chiang Chew, Hsinchu (TW); Shih-Chieh Tai, Hsinchu (TW); Chin-Nan Yen, Hsinchu (TW); Fu-Ja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 517 days.

(21) Appl. No.: 12/153,908

(22) Filed: May 28, 2008

(65) Prior Publication Data
US 2009/0138649 A1    May 28, 2009

(30) Foreign Application Priority Data
Nov. 23, 2007   (TW) .............................. 96144467 A

(51) Int. Cl.
*G06F 12/00*    (2006.01)

(52) U.S. Cl. ........................................ 711/103; 365/227
(58) Field of Classification Search .................. 711/103; 365/227
See application file for complete search history.

(56) References Cited

U.S. PATENT DOCUMENTS

| 5,603,001 A * | 2/1997 | Sukegawa et al. ............ 711/103 |
| 7,305,514 B2 * | 12/2007 | Roohparvar .................. 711/103 |
| 2003/0204688 A1 * | 10/2003 | Lee .............................. 711/158 |

* cited by examiner

*Primary Examiner* — Hashem Farrokh
(74) *Attorney, Agent, or Firm* — Rosenberg, Klein & Lee

(57) ABSTRACT

A nonvolatile memory system has a controller chip connected to a memory medium and several nonvolatile memory chips. The memory medium stores program codes for the controller chip to distribute an operation of the nonvolatile memory chips upon an instruction over time, so as to decentralize the peak current caused by the operation and thereby improve the stability of the system.

13 Claims, 7 Drawing Sheets

NONVOLATILE MEMORY SYSTEM AND METHOD OF DECENTRALIZING THE PEAK CURRENT IN A NONVOLATILE MEMORY SYSTEM

FIELD OF THE INVENTION

The present invention is related generally to a nonvolatile memory system and, more particularly, to decentralization of the peak current in a nonvolatile memory system.

BACKGROUND OF THE INVENTION

More and more applications have been found for nonvolatile memories such as flash memories. For example, it is popular to use flash memories in mobile phones, digital cameras, personal digital assistants and portable drives. Currently, memory card is one of the most popular products of flash memories, in which a controller chip is used to control the receiving of data from a host such as a card reader, and the writing of the data into the flash memory. However, the memory card is designed with more and more memory capacity, and to increase the memory capacity of a memory card, there are usually two solutions, one is to increase the memory capacity of single flash memory chip, and the other is to increase the number of flash memory chips in a memory card. For the latter case, the power consumption during the operation of the flash memories in a memory card becomes a thorny problem.

FIG. 1 shows the operational current when a flash memory chip operates upon an erase instruction, and FIG. 2 shows the total operational current when two flash memory chips are simultaneously erased. Typically, a flash memory chip may require a peak current more than 100 mA when it is erased. For example, in a memory card composed of a controller chip with the serial no. SK6626AAPC and flash memory chips with the serial no. TC58NVG3D1D, single flash memory chip requires an extra current between 125 mA and 133 mA when it is erased, as shown in FIG. 1. The extra current is referred to the difference between the maximum and the minimum of an operational current. As shown in FIG. 2, when two flash memory chips are simultaneously erased in a word mode, the extra current becomes about 230 mA to 239 mA. Briefly, the peak current caused by the simultaneous operations of several flash memory chips in a conventional flash memory system is proportional to the number of the flash memory chips. A great peak current will bring the power supply into unstable condition and thereby degrade the stability and reliability of the operation of the host, the controller chip and the flash memory chip.

Conventionally, the solution for this peak current issue is directed to the improvement of the hardware design of the memory system itself, so as to source the power for different components at different time points, which are conventionally provided power at a same time. For example, U.S. Pat. Nos. 7,085,189, 7,224,617 and 7,200,062 are such arts. In U.S. Pat. No. 7,085,189, flash memory ships are divided into four banks for data storage, among which three are added with delay circuit such that the four memory banks will be erased at different time points upon an erase instruction, so as to reduce the peak current when the four memory banks are to be erased. U.S. Pat. No. 7,224,617 provides a high speed operation mode and a low current consumption mode for a flash memory system, and in the high speed operation mode, if the peak current causes the flash memory system and the host it is connected unstable, the system will switch to the low current consumption mode. U.S. Pat. No. 7,200,062 sets different time delays for different DRAM chips when the system is to refresh the DRAM chips, so as to decentralize the peak current produced by the refresh operation.

However, prior arts all focus on improving the hardware design of the memory system to decentralize the intensity and the occurrence time of the peak current, which needs to change the hardware design and is less flexibility. Therefore, an alternative approach which does not require to change the hardware design of a nonvolatile memory system to decentralize the peak current thereof is desired.

SUMMARY OF THE INVENTION

An object of the present invention is to provide a nonvolatile memory system and control method thereof, to decentralize the peak current when the nonvolatile memory system operates upon an instruction.

Another object of the present invention is to provide a memory medium storing program codes for a nonvolatile memory system to decentralize the peak current when it is in an operation.

A nonvolatile memory system according to the present invention comprises a controller chip connected to several nonvolatile memory chips and a memory medium. The memory medium stores program codes, and the controller chip decentralizes an operation according to the program codes when it is to operate the nonvolatile memory chips upon an instruction. Preferably, in an operation of the nonvolatile memory chips upon an instruction, the controller chip will send a first command to a first one of the nonvolatile memory chips, and wait for a period of time before further sending a second command to a second one of the nonvolatile memory chips. Alternatively, in an operation of the nonvolatile memory chips upon an instruction, the controller chip will send a first command to a first one of the nonvolatile memory chips, and further send a second command to a second one of the nonvolatile memory chips after receiving a response signal from the first nonvolatile memory chip. Therefore, the nonvolatile memory chips to be operated by the controller chip upon an instruction will not all operate at a same time.

By distributing the operation of the nonvolatile memory chips upon an instruction over time, especially sending commands to each of the nonvolatile memory chips at different time points, the peak current of the entire system is reduced. Furthermore, this improvement is made by software approach, and thus does not need any change or modification to the hardware architecture.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
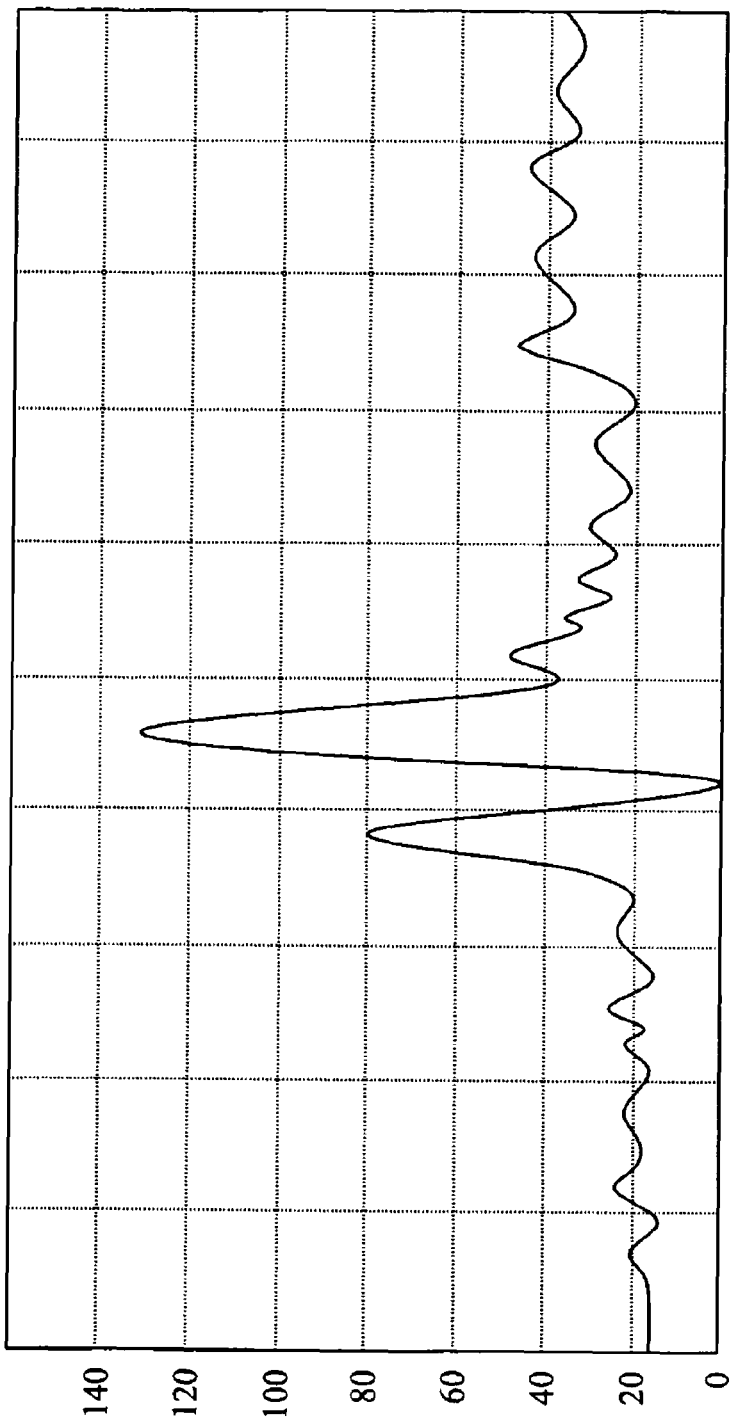
FIG. 1 is a waveform diagram showing the operational current when a flash memory chip is erased.
Figure 2:
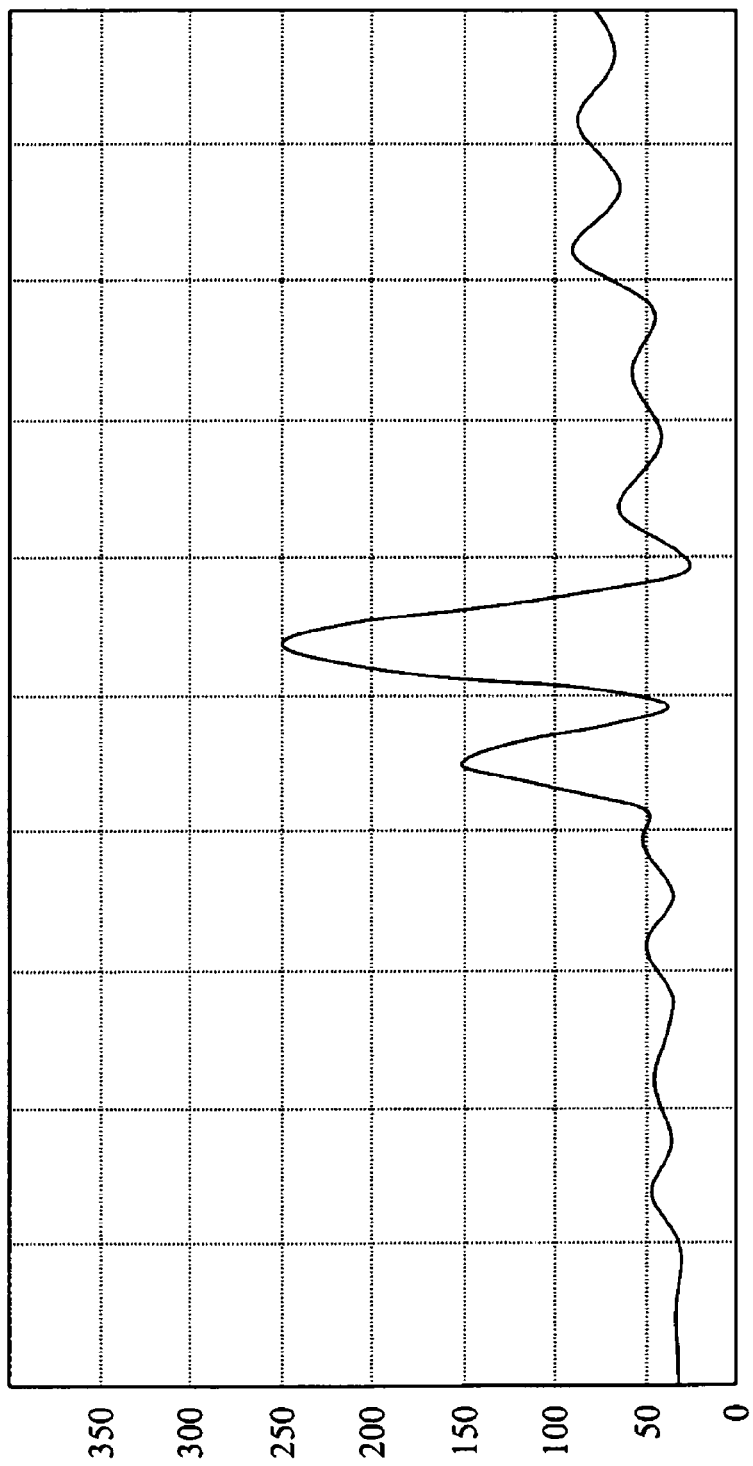
FIG. 2 is a waveform diagram showing the operational current when two flash memory chips are simultaneously erased.
Figure 3:
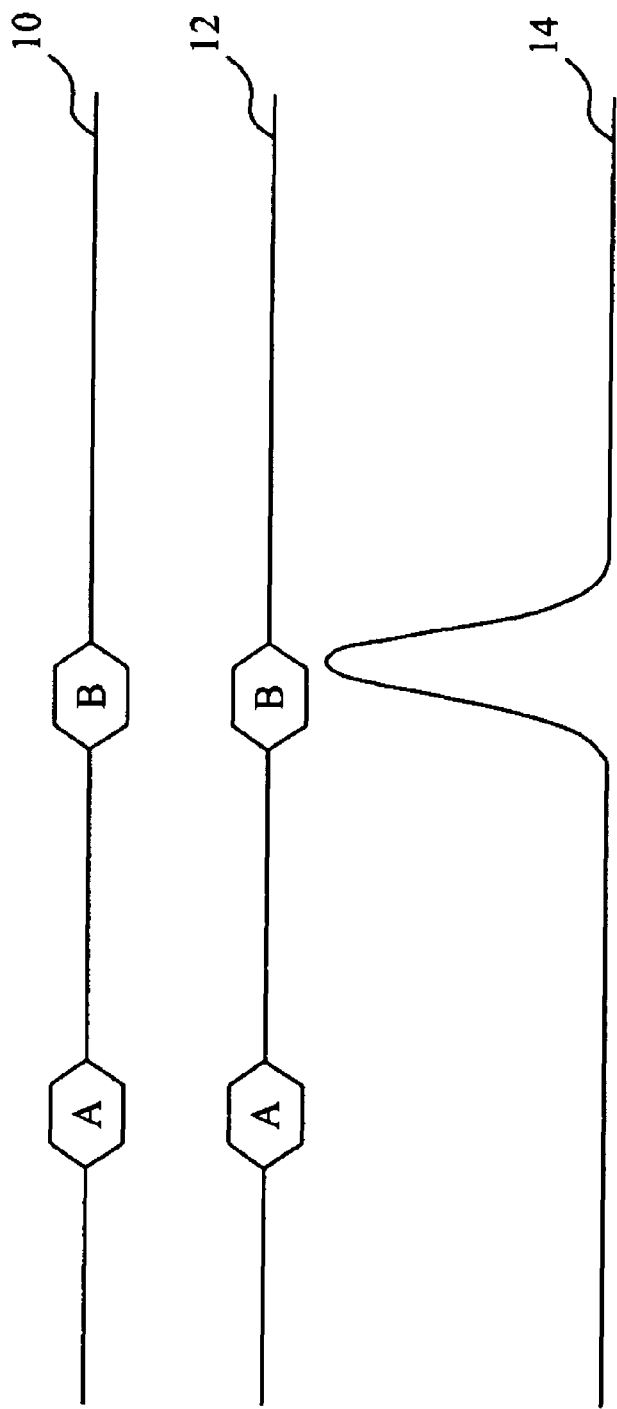
FIG. 3 shows a timing correspondence between an instruction execution and the operational current it causes in a conventional nonvolatile memory system.

FIG. 3 shows a timing correspondence between an instruction execution and the operational current it causes in a conventional nonvolatile memory system, in which waveform 10 represents the erase signal sent to a first nonvolatile memory chip, waveform 12 represents the erase signal sent to a second nonvolatile memory chip, and waveform 14 represents the operational current of the entire nonvolatile memory system. For example, in a conventional nonvolatile memory system including several flash memory chips, to erase the flash memory chips, the controller chip will sequentially send a command A and a command B to each flash memory chip, as shown by the waveforms 10 and 12 of FIG. 3. Typically the space time between the commands A and B is loose, and each flash memory chip will execute the erase operation only when it receives the command A and thereafter the command B. In a conventional system, a command B is sent to each memory chip at a same time, and therefore, almost all of the flash memory chips will receive the command B at a same time and execute the erase operation simultaneously. As a result, the peak current for this erase instruction is centralized at a time point, as shown by the waveform 14 of FIG. 3.

Figure 4:
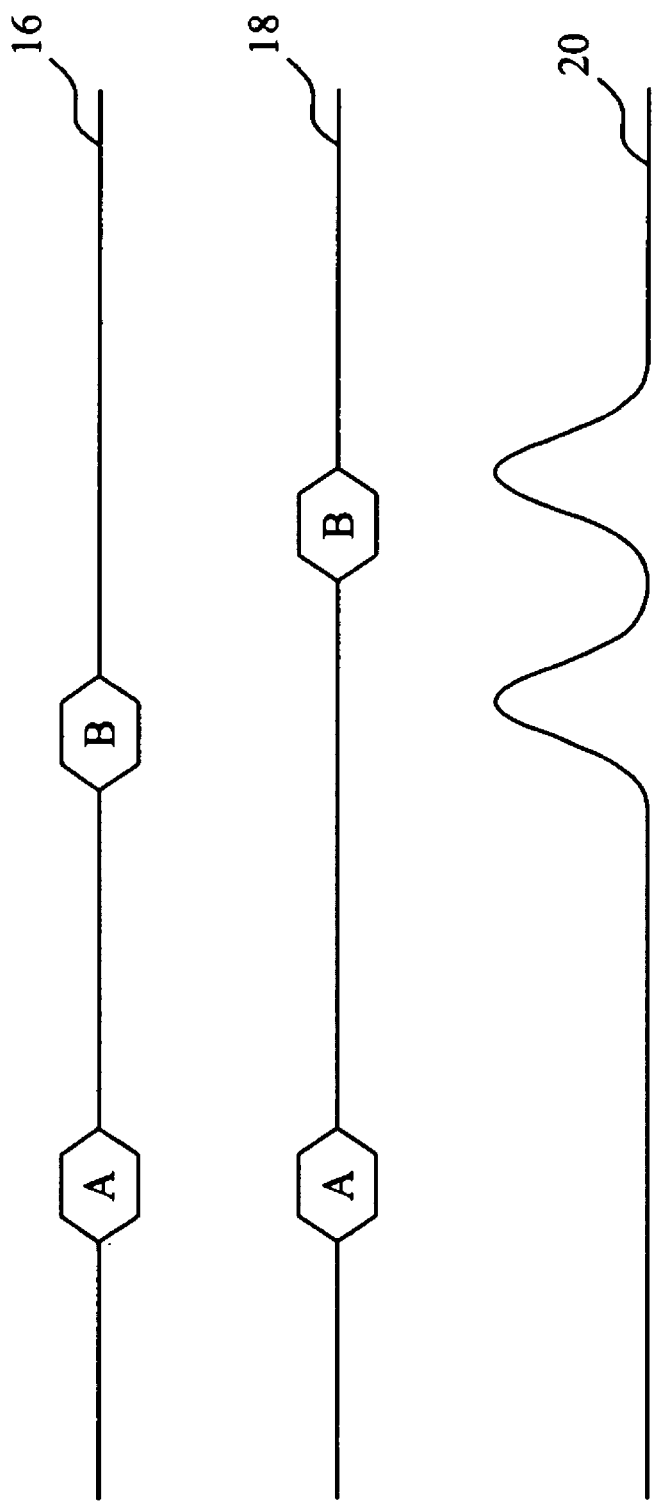
FIG. 4 shows a timing correspondence between an instruction execution and the operational current it causes in a nonvolatile memory system according to the present invention.

Since the peak current caused by the operation of several nonvolatile memory chips upon an instruction at a same time is proportional to the number of the nonvolatile memory chips, it may reduce the peak current by operating the nonvolatile memory chips at different time points. FIG. 4 shows a timing correspondence between an instruction execution and the operational current it causes in a nonvolatile memory system according to the present invention, in which waveform 16 represents the erase signal sent to a first nonvolatile memory chip, waveform 18 represents the erase signal sent to a second nonvolatile memory chip, and waveform 20 represents the operational current of the entire nonvolatile memory system. For example, a command B is sent to a first nonvolatile memory chip, and after a period of time, a command B is sent to a second nonvolatile memory chip, as shown by the waveforms 16 and 18 of FIG. 4. Since the two nonvolatile memory chips receive their commands B's at different time points, they will execute erase operations at different time points, even though the erase operations are triggered by a same instruction. If the space time between the commands B's that are sent to the two nonvolatile memory chips is longer enough, the operational current caused by operating the two nonvolatile memory chips will be separated to have two peaks at two time points, and the peak current will be significantly reduced, as shown by the waveform 20 of FIG. 4. In other words, decentralizing the operation time of several flash memory chips such that at any moment there are less flash memory chips executing a command will distribute the peak current of the entire system over time, thereby reducing the peak current and improving the stabilities of the nonvolatile memory system and the host it is connected.

Figure 5:
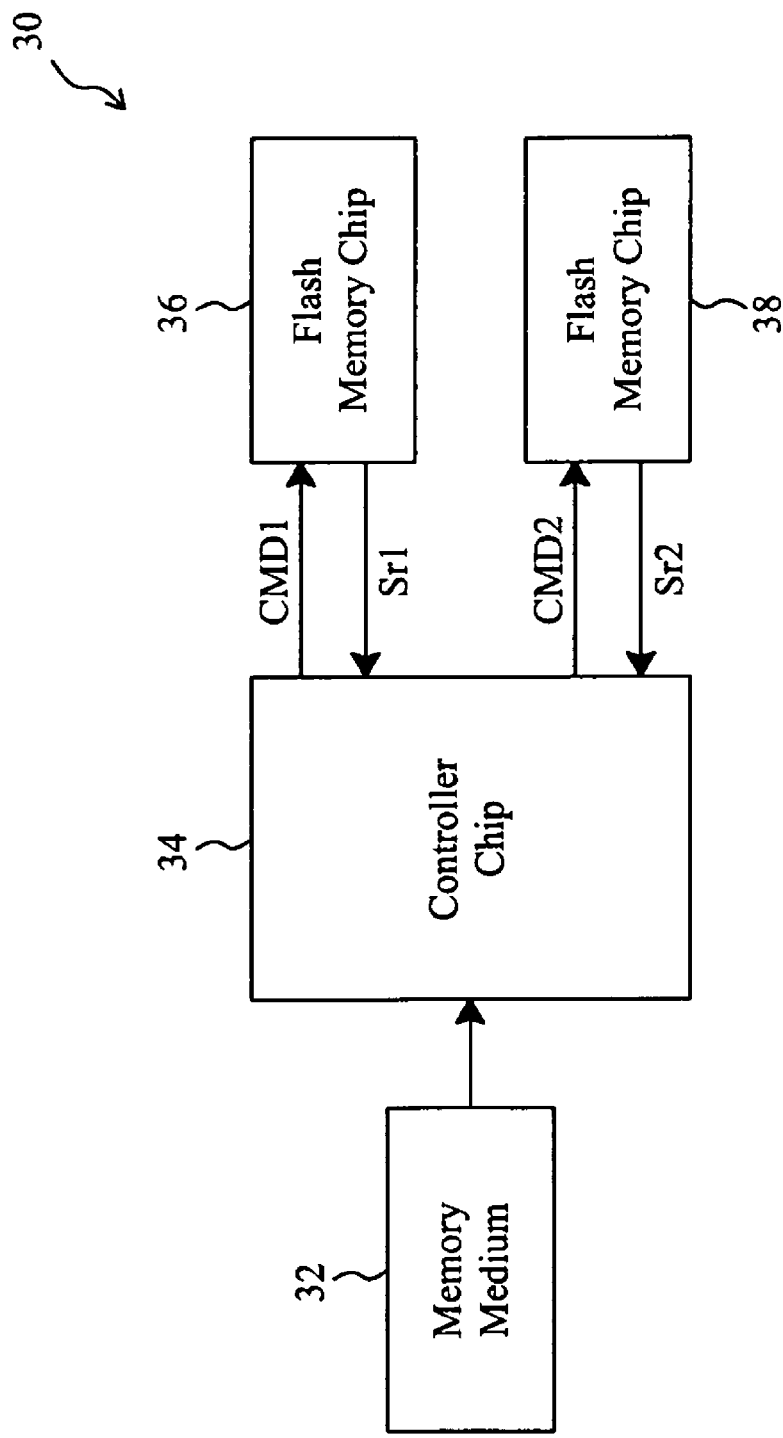
FIG. 5 is an embodiment of a nonvolatile memory system according to the present invention.
Figure 6:
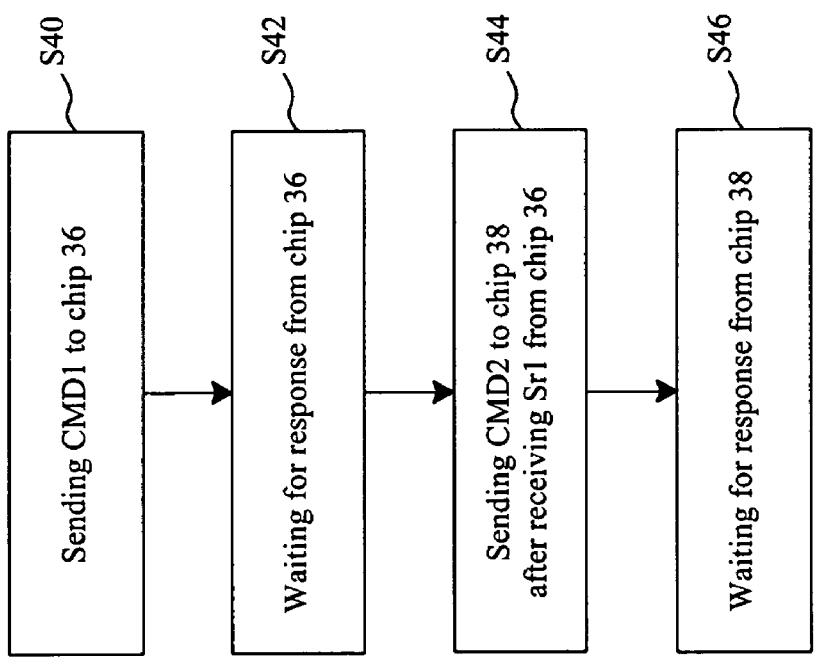
FIG. 6 is a flowchart for the operation of the controller chip shown in FIG. 5.

FIG. 5 shows a nonvolatile memory system 30 according to the present invention, in which a memory medium 32 is connected to the controller chip 34 and stores program codes to be accessed by the controller chip 34, and two flash memory chips 36 and 38 are connected to the controller chip 34 and could be operated by the controller chip 34. The memory medium 32 may be a firmware, for example a Read-Only Memory (ROM). When the controller chip 34 is to operate the flash memory chips 36 and 38 upon an instruction such as an erase instruction, it will distribute the operation of the flash memory chips 36 and 38 over time according to the program codes in the memory medium 32. For further detail, FIG. 6 provides a flowchart of the process that the controller chip 34 operates the flash memory chips 36 and 38 upon an instruction. Referring to FIGS. 5 and 6, when the controller chip 34 receives an instruction, for example one to erase the flash memory chips 36 and 38, so as to operate the flash memory chips 36 and 38, it will send a command CMD1 to the flash memory chips 36 first, as shown in Step S40, and then wait for response from the flash memory chips 36 first, as shown in Step S42. After the flash memory chip 36 receives the command CMD1, it will send a response signal Sr1 to the controller chip 34. As shown in Step S44, the controller chip 34 will send a command CMD2 to the flash memory chips 38 after it receives the response signal Sr1. Then, the controller chip 34 waits for response from the flash memory chips 38 in Step S46. After the flash memory chip 38 receives the command CMD2, it will send a response signal Sr2 to the controller chip 34. After the controller chip 34 receives the response signal Sr2, the instruction to operate the flash memory chips 36 and 38 is to be completed.

Figure 7:
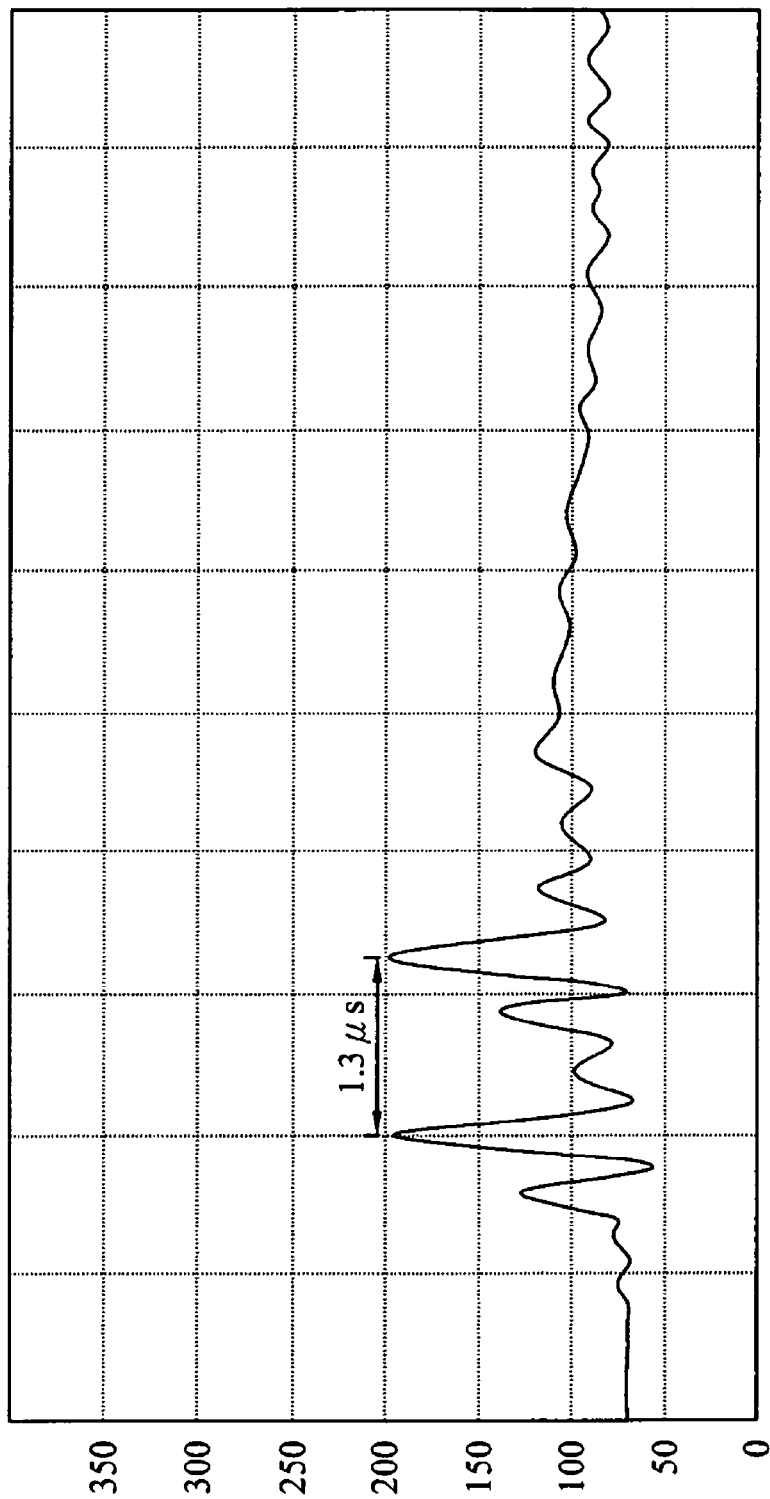
FIG. 7 is a waveform diagram showing the operational current in a simulation when a method according to the present invention is used in a nonvolatile memory system.

FIG. 7 shows the operational current in a simulation when a method according to the present invention is used in a memory card composed of a controller chip with the serial no. SK6626 and two flash memory chips with the serial no. TC58NVG3D1D. In this simulation, upon an instruction, the two flash memory chips execute erase operations initiated at different time points, and thereby produce two peaks in the entire system current as shown in FIG. 7. The simulation result shows that the extra currents for each erase operation of the flash memory chips are not over 150 mA. The efficiency reduction caused by the method of decentralizing the peak current according to the present invention is negligible. As shown in FIG. 7, the space time between the two peaks is about 1.3 μs, and a flash memory chip typically needs about 1 ms-3 ms to complete an erase operation. If executing erase operation needs 1 ms, it only causes 0.13% efficiency reduction in this simulation.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A nonvolatile memory system comprising:
   a controller chip;
   a plurality of nonvolatile memory chips, each connected to the controller chip; and
   a memory medium connected to the controller chip, having program codes stored therein;
   wherein the controller chip is configured to decentralize execution of an operation of the plurality of nonvolatile memory chips over time according to the program codes when it simultaneously sends operation signals to operate the plurality of nonvolatile memory chips, so as to reduce a peak current caused by the operation.

2. The nonvolatile memory system of claim 1, wherein each of the instruction operation signals is an erase signal.

3. The nonvolatile memory system of claim 1, wherein according to the program codes, the controller chip sends a first command to a first one of the plurality of nonvolatile memory chips and then sends a second command to a second one of the plurality of nonvolatile memory chips before the first nonvolatile memory chip completes operation of the first command.

4. The nonvolatile memory system of claim 1, wherein according to the program codes, the controller chip sends a first command to a first one of the plurality of nonvolatile memory chips, and after receiving a response signal from the first nonvolatile memory chip, sends a second command to a second one of the plurality of nonvolatile memory chips before the first nonvolatile memory chip completes operation of the first command.

5. The nonvolatile memory system of claim 1, wherein the memory medium comprises a ROM.

6. A computer-readable memory medium storing program codes for a controller chip to operate a plurality of nonvolatile memory chips upon an instruction, comprising the steps of:
   simultaneously sending a first command and a second command respectively to a first one and a second one of the plurality of nonvolatile memory chips according to the instruction;
   sending a third command to the first one of the plurality of nonvolatile memory chips such that the first one of the plurality of nonvolatile memory chips executes an operation; and
   after a period of time, sending a fourth command to the second one of the plurality of nonvolatile memory chips such that the second one of the plurality of nonvolatile memory chips executes the operation before the first nonvolatile memory chip completes the operation.

7. The computer-readable memory medium of claim 6, wherein the operation is an erase operation.

8. A computer-readable memory medium storing program codes for a controller chip to operate a plurality of nonvolatile memory chips upon an instruction, comprising the steps of:
   simultaneously sending a first command and a second command respectively to a first one and a second one of the plurality of nonvolatile memory chips according to the instruction;
   sending a third command to the first one of the plurality of nonvolatile memory chips such that the first one of the plurality of nonvolatile memory chips executes an operation;
   waiting until a receipt response signal from the first one of the plurality of nonvolatile memory chips is received; and
   sending a fourth command to the second one of the plurality of nonvolatile memory chips such that the second one of the plurality of nonvolatile memory chips executes the operation before the first nonvolatile memory chip completes the operation.

9. The computer-readable memory medium of claim 8, wherein the operation is an erase operation.

10. A method of decentralizing a peak current in a nonvolatile memory system when operating a plurality of nonvolatile memory chips of the nonvolatile memory system upon an instruction, the method comprising the steps of:
    simultaneously sending a first command and a second command respectively to a first one and a second one of the plurality of nonvolatile memory chips according to the instruction;
    sending a third command to the first one of the plurality of nonvolatile memory chips such that the first one of the plurality of nonvolatile memory chips executes an operation;
    after sending the third command, waiting a period of time shorter than an operation time for the first nonvolatile memory chip to complete the operation; and
    after the period of time, sending a fourth command to the second one of the plurality of nonvolatile memory chips such that the second one of the plurality of nonvolatile memory chips executes the operation before the first nonvolatile memory chip completes the operation.

11. The method of claim 10, wherein the operation is an erase operation.

12. A method of decentralizing a peak current in a nonvolatile memory system when operating a plurality of nonvolatile memory chips of the nonvolatile memory system upon an instruction, the method comprising the steps of:
    simultaneously sending a first command and a second command respectively to a first one of the plurality of nonvolatile memory chips and a second one of the plurality of nonvolatile memory chips according to the instruction;
    sending a third command to the first one of the plurality of nonvolatile memory chips such that the first one of the plurality of nonvolatile memory chips executes an operation;
    waiting until a receipt response signal from the first one of the plurality of nonvolatile memory chips is received; and
    sending a fourth command to the second one of the plurality of nonvolatile memory chips such that the second one of the plurality of nonvolatile memory chips executes the operation before the first nonvolatile memory chip completes the operation.

13. The method of claim 12, wherein the operation is an erase operation.

* * * * *